US008736814B2

(12) United States Patent
He et al.

(10) Patent No.: US 8,736,814 B2
(45) Date of Patent: May 27, 2014

(54) LITHOGRAPHY WAVE-FRONT CONTROL SYSTEM AND METHOD

(75) Inventors: Yuan He, Boise, ID (US); Jianming Zhou, Boise, ID (US); Scott L. Light, Boise, ID (US); Anton deVilliers, Boise, ID (US); Kaveri Jain, Boise, ID (US); Zishu Zhang, Boise, ID (US); Dan Millward, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 319 days.

(21) Appl. No.: 13/159,245

(22) Filed: Jun. 13, 2011

(65) Prior Publication Data

US 2012/0314196 A1 Dec. 13, 2012

(51) Int. Cl.
*G03B 27/54* (2006.01)
*G03B 27/32* (2006.01)
*G03F 7/20* (2006.01)

(52) U.S. Cl.
CPC ........ *G03F 7/70125* (2013.01); *G03F 7/70091* (2013.01); *G03F 7/70308* (2013.01); *G03F 7/705* (2013.01)
USPC .................................. 355/67; 355/71; 355/77

(58) Field of Classification Search
CPC ............ G03F 7/70266; G03F 7/70308; G03F 7/70125; G03F 7/70091; G03F 7/705
USPC .............................. 355/30, 53, 55, 67, 71, 77
See application file for complete search history.

(56) References Cited

U.S. PATENT DOCUMENTS

| 6,335,130 B1 * | 1/2002 | Chen et al. ...................... 430/5 |
| 7,261,985 B2 * | 8/2007 | Smith et al. ..................... 430/30 |
| 2005/0240895 A1 | 10/2005 | Smith et al. |
| 2008/0123066 A1 * | 5/2008 | Hendricus Jansen et al. .. 355/30 |
| 2008/0297753 A1 * | 12/2008 | Wang et al. ..................... 355/67 |
| 2009/0296055 A1 | 12/2009 | Ye et al. |
| 2009/0296060 A1 * | 12/2009 | Finders ........................... 355/63 |
| 2010/0123887 A1 * | 5/2010 | De Winter et al. .............. 355/55 |

OTHER PUBLICATIONS

Smith, Bruce W., et al., "Understanding lens aberration and influences to lithographic imaging", Proc. of SPIE, vol. 4000, Optical Microlithography XIII, (Mar. 2000), 13.
Sparkes, Christopher, et al., "45nm Lithography—It's All About the Lens", Front end of Line, Future Fab International, Issue 24, www.future-fab.com, 3.

* cited by examiner

*Primary Examiner* — Steven H Whitesell Gordon
(74) *Attorney, Agent, or Firm* — Schwegman, Lundberg & Woessner, P.A.

(57) ABSTRACT

Some embodiments include system and methods to obtain information for adjusting variations in features formed on a substrate of a semiconductor device. Such methods can include determining a first pupil in an illumination system used to form a first feature, and determining a second pupil used to form a second feature. The methods can also include determining a pupil portion belonging to only one of the pupils, and generating a modified pupil portion from the pupil portion. Information associated with the modified pupil portion can be obtained for controlling a portion of a projection lens assembly of an illumination system. Other embodiments are described.

23 Claims, 10 Drawing Sheets

LITHOGRAPHY WAVE-FRONT CONTROL SYSTEM AND METHOD

BACKGROUND

Semiconductor devices, such as memory devices and processors, can include numerous device features. A photolithography system is often used during part of the fabrication to form at least some of these features. A conventional photolithography system can include a set of lenses to project light onto the device to create the features. Factors such as lens aberrations can cause the printed features to deviate from their designed dimensions and locations on wafer. Such deviations may lead to inferior or defective devices. In other cases, process optimization may require to retarget a feature's dimension or location using an imaging-only solution without any physical changes to a perfect lenses system.

DETAILED DESCRIPTION

Figure 1:
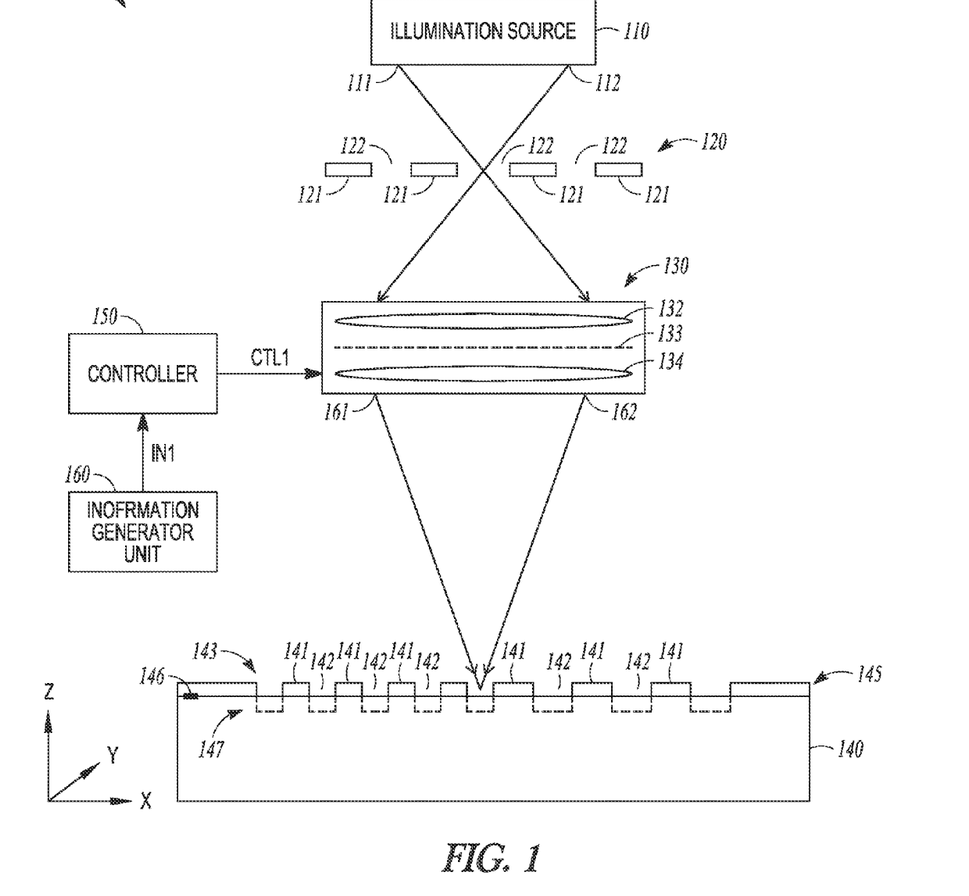
FIG. 1 shows a block diagram of an illumination system, according to an embodiment of the invention.

FIG. 1 shows a block diagram of an illumination system 100, according to an embodiment of the invention. Illumination system 100 can be used as part of a photolithography process in producing a device, such as a semiconductor memory device. As shown in FIG. 1, illumination system 100 includes an illumination source 110 to direct light from locations 111 and 112 to a mask 120. Mask 120 includes mask patterns having regions 121 and 122. A projection lens assembly 130 projects light passing through regions 122 of mask 120 onto a substrate 140. For simplicity, FIG. 1 shows only two light beams passing through only one of regions 122. Many light beams from illumination source 110 can pass through each of regions 122. Lights from locations 111 and 112 can be provided from an off-axis source, such as a dipole source. Other illumination sources can be used.

Substrate 140 can be a part of a semiconductor wafer. As shown in FIG. 1, substrate 140 includes a material 145, which can include a photo-sensitive material. Light from projection lens assembly 130 can form patterns 143 in material 145. Patterns 143 can include features 141 and 142 that can correspond to lines and spaces, respectively, of patterns 143. Features 141 and 142 can be used (e.g., use in an etching process) to form features 147 in substrate 140. Features 147 can be part of a device, such as a memory device. Substrate 140 can also include a reference location 146, which can be used to determine relative locations or dimension of features 141 and 142 or features 147.

Illumination system 100 can also include a controller 150 to receive information IN1 and generate control information CTL1 based on information IN1. Controller 150 can include a computer or a processor to process information. Controller 150 may use control information CTL1 to adjust projection lens assembly 130 in order to appropriately produce patterns 143 in material 145.

An information generator unit 160 can generate information IN1, which can include information from a modeling (e.g., from software simulation) of patterns 143. Information generator unit 160 can include a computer and simulation software used to model patterns 143. Commercial available photolithography simulation software can be used to model patterns 143. Information IN1 can include information of a set of Zernike polynomial coefficients generated from a modeling of patterns 143. Information IN1 can also include information of a wave-front map having phase and amplitude information and X-Y coordinates describing a wave-front adjustment of a pupil associated with illumination system 100. Modeling of patterns, such as patterns 143, to obtain information (such as information IN1) is described in detail with reference to FIG. 10 through FIG. 23.

Illumination system 100 may also include additional elements associated with photolithography systems. Such additional elements are omitted from FIG. 1 so as not to obscure the embodiments described herein.

As shown in FIG. 1, projection lens assembly 130 can include a lens 132, a phase shifter 134, and a pupil 133. Pupil 133 is a virtual X-Y plane within projection lens assembly 130. The X-Y plane is perpendicular to a Z-axis. Phase shifter 134 can be located at a Z position that is near to the Z-position of pupil 133. FIG. 1 shows an example of phase shifter 134 being under pupil 133. Phase shifter 134 can be located over pupil 133. FIG. 1 shows projection lens assembly 130 having only one lens 132 as an example. Projection lens assembly 130 can include more than one lense.

Patterns 143 can be formed from interferences of wave-fronts associated with light from a location 161 and wave-fronts associated with light from a location 162 at projection lens assembly 130. Each of location 161 and 162 can include numerous lights beams. FIG. 1 shows only one light beam from each of locations 161 and 162 for simplicity. Locations 161 and 162 can correspond to portions of pupil 133 that have a relatively higher localized light intensity than that of the rest of pupil 133.

Figure 2:
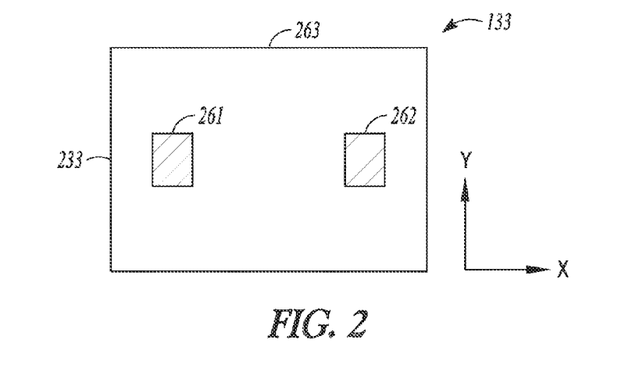
FIG. 2 shows a pupil associated with the illumination system of FIG. 1, according to an embodiment of the invention.

FIG. 2 shows pupil 133 of FIG. 1 having a profile 233, according to an embodiment of the invention. Profile 233 includes pupil portions 261, 262, and 263. FIG. 2 shows pupil portions 261 and 262 (with line texture) being different from pupil portion 263 (without line texture) to indicate that light intensity at pupil portions 261 and 262 is substantially higher than that at pupil portion 263. Each of pupil portions 261 and 262 can be referred to as a pupil fill of pupil 133.

Profile 233 of pupil 133 in FIG. 2 can be changed in order to adjust the dimensions of patterns 143. For example, controller 150 can adjust phase shifter 134 to change (e.g., delay) the phase of light from one of pupil portions 261 and 262 (e.g., pupil portion 262) and keep the phase of light from the other pupil portion (e.g., pupil portion 261) unchanged. Changing the phases at pupil portions 261 and 262 would also change the phase difference between lights at pupil portions 261 and 262. The change in the phase difference can change the locations of interferences of wave-fronts associated with lights from pupil portions 261 and 262. Controller 150 can adjust phase shifter 134 by adjusting selected zones in phase shifter 134.

Figure 3:
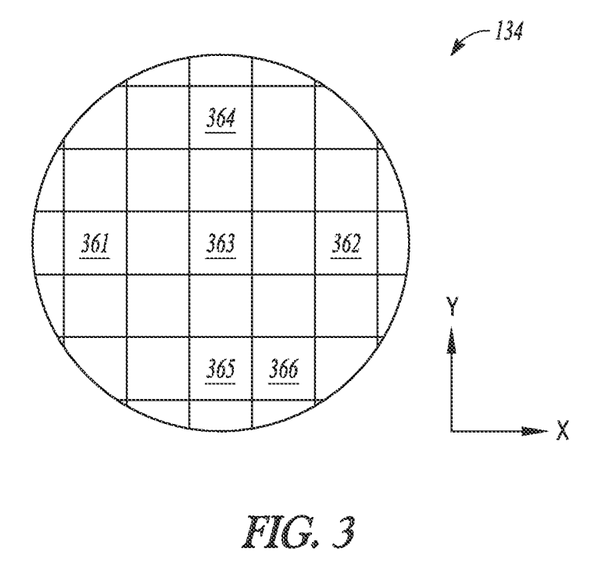
FIG. 3 shows an X-Y plan view of a phase shifter of the illumination system of FIG. 1, according to an embodiment of the invention.

FIG. 3 shows an X-Y plan view of phase shifter 134 of FIG. 1, according to an embodiment of the invention. Phase shifter 134 can include multiple zones arranged in a grid pattern in the X-Y plane. For simplicity, only six zones of phase shifter 134 are given label designations, such as zones 361 through 366. Different zones have different associated X-Y coordinates. The zones can be individually controlled to adjust the phase of light passing through each zone. For example, the size and shape of each zone can be physically altered based on control information, such as control information CTL1 of FIG. 1.

The zones of phase shifter 134 can be controlled (e.g., adjusted) such that light passing through different zones can have different phases. Thus, a phase difference between lights passing through two or more different zones can be adjusted (e.g., reduced) by a delta phase angle (e.g., phase angel reduction). The propagations of different wave-fronts from two or more particular zones of phase shifter 134 to material 145 of substrate 140 can also change when the phase difference between lights at those particular zones change (e.g., reduced). When the phase difference changes, the interferences of wave-fronts at material 145 also change accordingly.

Thus, by selectively adjusting the zones of phase shifter 134 to change the phase of light at the zones being adjusted, patterns 143 can be shifted, for example, along the X-axis, in a direction away from or toward reference location 146 of substrate 140 (FIG. 1). The focus of patterns 143 can also be adjusted (e.g., moved in a direction along the Z-axis of FIG. 1) by selectively adjusting the zones of phase shifter 134.

Figure 4:
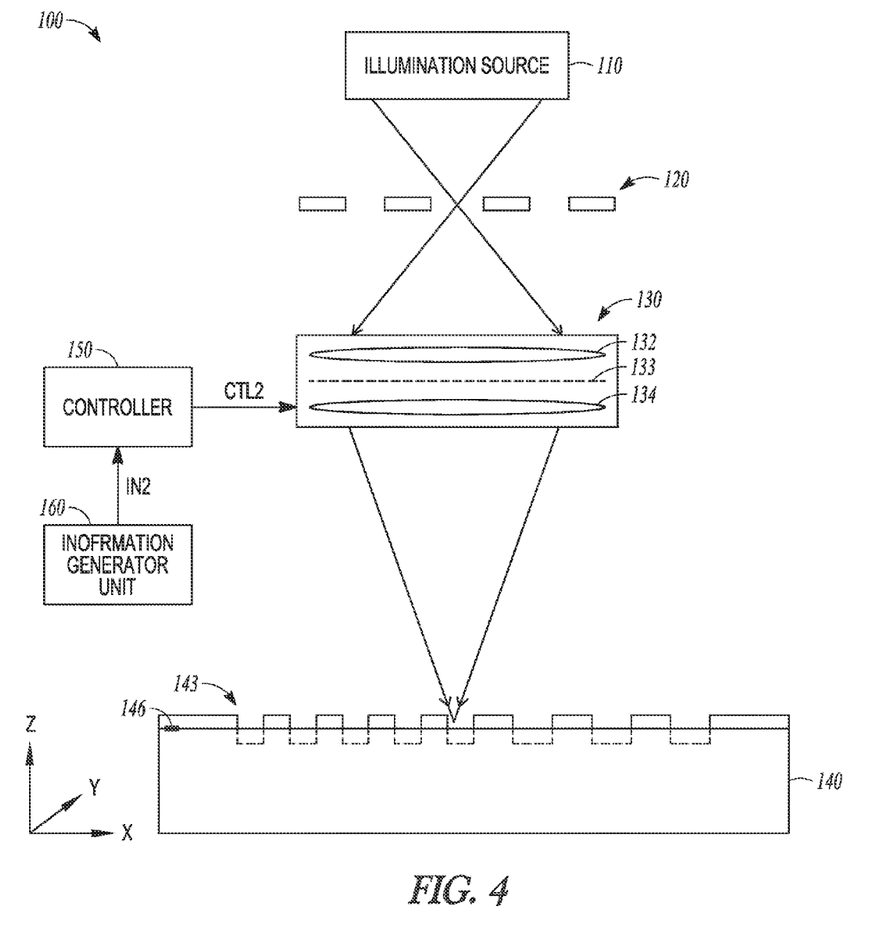
FIG. 4 shows the illumination system of FIG. 1, including an example of patterns shifting toward a reference location, according to an embodiment of the invention.

FIG. 4 shows illumination system 100 of FIG. 1, including an example of patterns 143 shifting away from reference location 146 along the X-axis, according to an embodiment of the invention. For simplicity, the description of similar elements shown in FIG. 1 through FIG. 9 is not repeated. Some label designations of similar elements in FIG. 1 are also omitted from FIG. 4, FIG. 6, and FIG. 8.

In FIG. 4, controller 150 can generate control information CTL2 based on information IN2. Controller 150 can use control information CTL2 to adjust phase shifter 134 in order to cause patterns 143 to shift. Information IN2 and control information CTL2 can have values different from those of information IN1 and control information CTL1, respectively, of FIG. 1. Thus, pupil 133 in FIG. 4 can have a profile different from that of FIG. 2.

Figure 5:
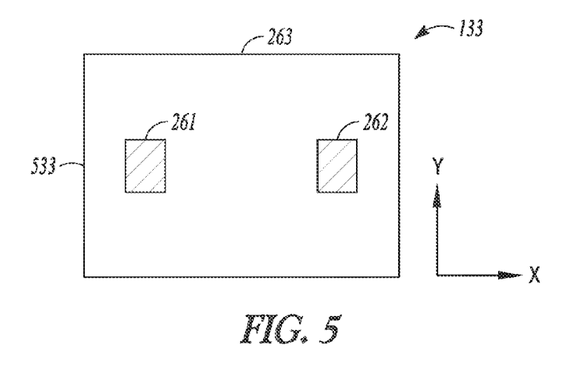
FIG. 5 shows a pupil associated with the illumination system of FIG. 4, according to an embodiment of the invention.

FIG. 5 shows pupil 133 of FIG. 4 having a profile 533, according to an embodiment of the invention. In comparison with profile 233 of FIG. 2, the phases of the light at pupil portions 261 in profiles 233 and 533 can be the same. The phases of the light at pupil portions 262 are different. This indicates that the phase difference between lights at pupil portions 261 and 262 of profile 533 in FIG. 5 has been changed relative to that of FIG. 2. As described above, the change in phase difference can be obtained by selectively adjusting the zones of phase shifter 134 based on information IN2. Information IN2 can be generated in ways similar to or identical to those described below with reference to FIG. 10 through FIG. 14.

Figure 6:
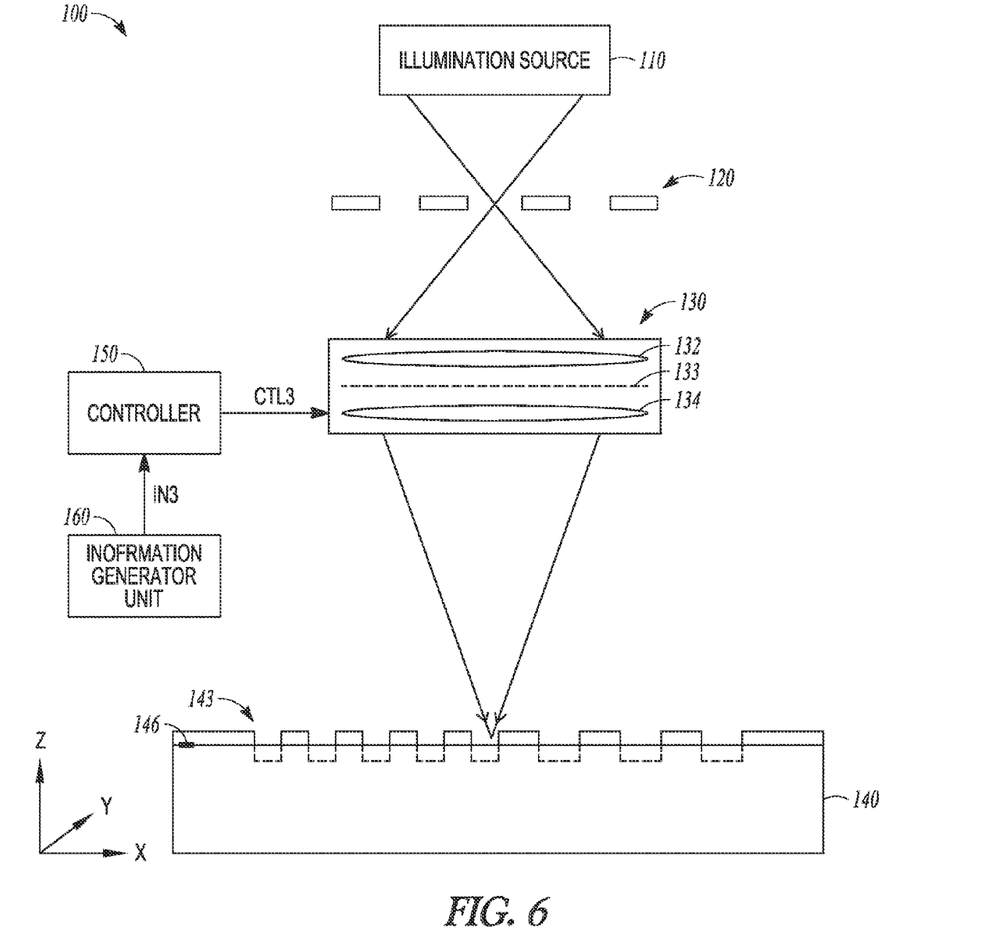
FIG. 6 shows the illumination system of FIG. 1, including an example of patterns shifting away from a reference location, according to an embodiment of the invention.

FIG. 6 shows illumination system 100 of FIG. 1, including an example of patterns 143 shifting toward reference location 146 along the X-axis, according to an embodiment of the invention. Controller 150 can generate control information CTL3 based on information IN3. Controller 150 can use control information CTL3 to adjust phase shifter 134 in order to cause patterns 143 to shift. Information IN3 and control information CTL3 can have values different from information IN1 and control information CTL1, respectively, of FIG. 1. Thus, pupil 133 in FIG. 6 can have a profile different from that of FIG. 2.

Figure 7:
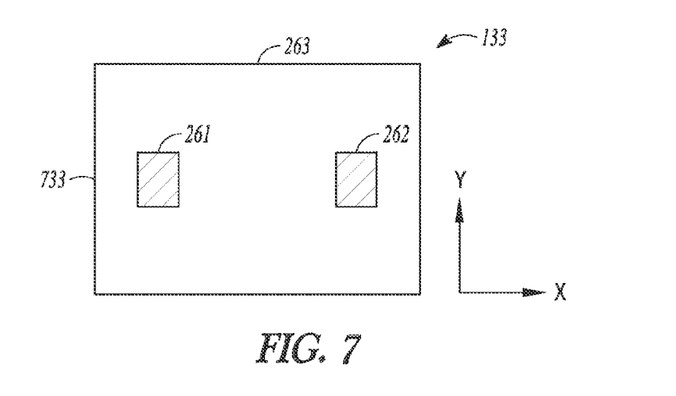
FIG. 7 shows a pupil associated with the illumination system of FIG. 6, according to an embodiment of the invention.

FIG. 7 shows a pupil 133 of FIG. 4 having a profile 733, according to an embodiment of the invention. In comparison with profile 233 of FIG. 2, the light phases at pupil portions 262 in profiles 233 and 733 can be the same. The light phases at pupil portions 261 are different. This indicates that the phase difference between lights at pupil portions 261 and 262 of profile 733 in FIG. 7 has been changed relative to that of FIG. 2. As described above, the change in the phase difference can be obtained by selectively adjusting the zones of phase shifter 134 based on information IN3. Information IN3 can be generated in ways similar to or identical to those described below with reference to FIG. 10 through FIG. 14.

Figure 8:
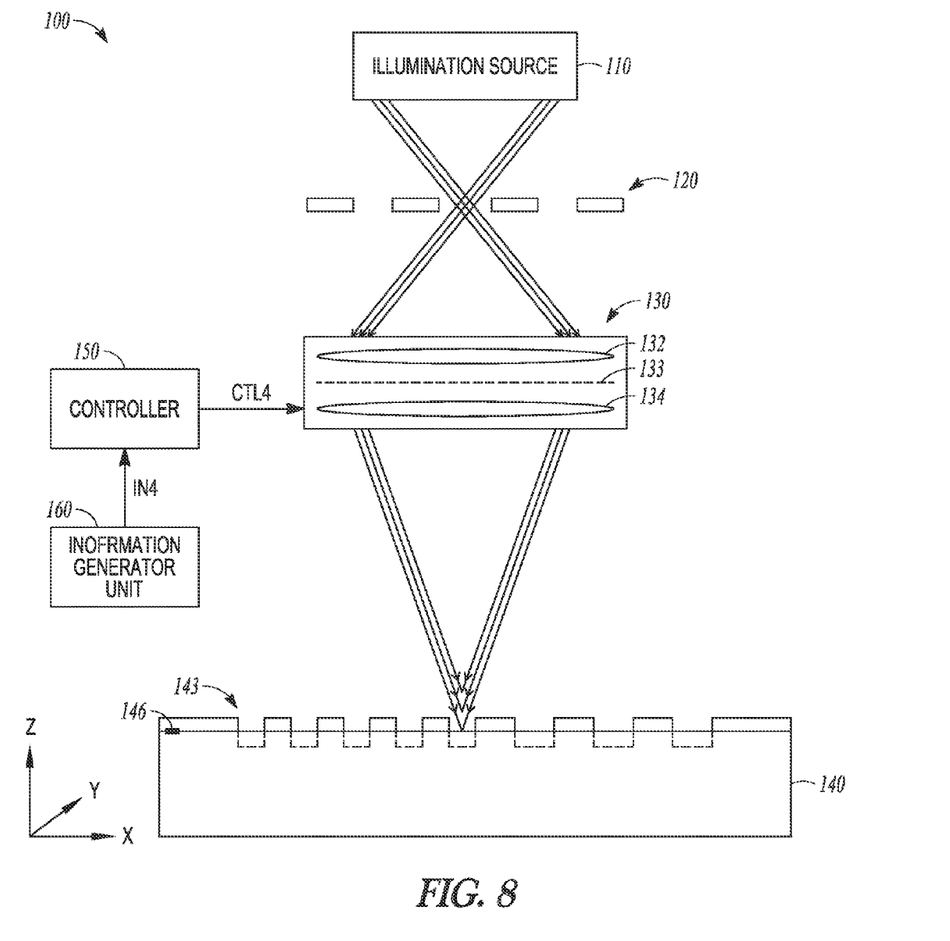
FIG. 8 shows the illumination system of FIG. 1, including an example of focus planes of patterns, according to an embodiment of the invention.

FIG. 8 shows illumination system 100 of FIG. 1, including an example of focus planes of patterns 143, according to an embodiment of the invention. As shown in FIG. 8, interferences of wave-fronts of light beams from projection lens assembly 130 can occur at different X-Y planes. The average of such planes can be considered as the best focus plane of patterns 143. Information IN4 can include best focus information of patterns 143. The best focus information can be obtained from modeling of patterns 143, such as by software simulation. Controller 150 can generate control information CTL4 based on information IN4. Controller 150 can use control information CTL4 to adjust phase shifter 134 in order to adjust the focus of patterns 143 to along the Z-axis based on the best focus information. Information IN4 and control information CTL4 can have values different from information IN1 and control information CTL1, respectively, of FIG. 1. Thus, pupil 133 in FIG. 8 can have a profile different from that of FIG. 2.

Figure 9:
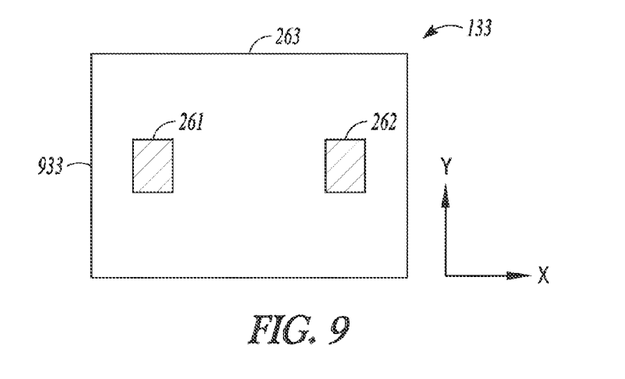
FIG. 9 shows a pupil associated with the illumination system of FIG. 8, according to an embodiment of the invention.

FIG. 9 shows pupil 133 of FIG. 8 having a profile 933, according to an embodiment of the invention. In comparison with profile 233 of FIG. 2, the light phases at pupil portions 261 in profiles 233 and 933 are different. The light phases at pupil portions 262 in profiles 233 and 933 are also different. This indicates that the phase difference between lights at pupil portions 261 and 262 has been changed relative to that of FIG. 2. As described above, the change in the phase difference can be obtained by selectively adjusting the zones of phase shifter 134 based on information IN4. Information IN4 can be generated in ways similar to or identical to those described below with reference to FIG. 15 through FIG. 22.

Figure 10:
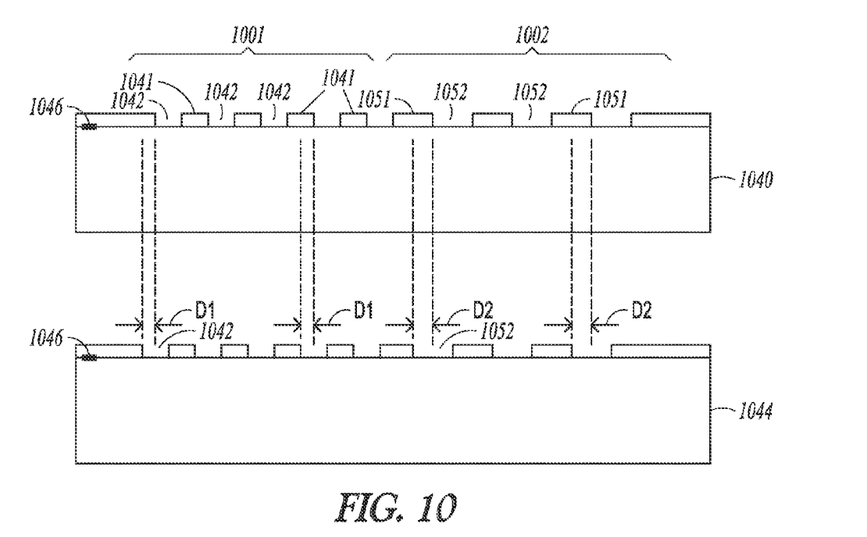
FIG. 10 shows example patterns on a substrate and associated pattern offsets, according to an embodiment of the invention.

FIG. 10 shows example patterns 1001 and 1002, according to an embodiment of the invention. The locations of patterns 1001 and 1002 on substrate 1040 are assumed to be intended locations. As shown in FIG. 10, patterns 1001 and 1002 on substrate 1044 can deviate from the intended locations. For example, patterns 1001 and 1002 on substrate 1044 are shifted toward a reference location 1046 along the X-axis by offsets D1 and D2, respectively, relative to their intended locations.

Pattern 1001 can include features 1041 and 1042 which can correspond to lines and spaces, respectively, of pattern 1001. Pattern 1002 can include features 1051 and 1052 which can correspond to lines and spaces, respectively, of pattern 1002. Patterns 1001 and 1002 can have different critical dimensions. For example, feature 1052 can have a width (measured along the X-axis) greater than the width of feature 1042. As an example, the widths of features 1052 and 1042 can be 100 nanometer (nm) and 45 nm, respectively.

Offsets D1 and D2 can be measured in units such as nanometers. FIG. 10 shows an example where offset D2 is greater than offset D1. Thus, the difference (e.g., ΔD) between offsets D1 and D2 is equal to the value of offset D2 minus the value of offset D1. For example, D2−D1=ΔD. The ΔD is sometimes referred to as a pattern location difference.

Various factors can cause patterns 1001 and 1002 on substrate 1044 to have offsets D1 and D2. Such factors can include undesirable effect of cold/hot lens aberrations in an illumination system used to produce patterns 1001 and 1002, different overlay-Zernike sensitivities between patterns 1001 and 1002 or between the center and the edge of an area of the substrate where patterns 1001 and 1002 are formed, and other factors.

The following description with reference to FIG. 11 through FIG. 14 describes an example for determining information for correcting (e.g., adjusting) or minimizing the undesirable shifts (e.g., shifts in the X direction) of patterns 1001 and 1002. The correction can include separately modeling pattern 1001 and pattern 1002, such as by software simulation. Then, information for correcting offsets D1 and D2 can be determined based on data obtained from each modeling. This information can correspond to information IN1, IN2, or IN3 (FIG. 1 though FIG. 7) and can be provided to a controller of an illumination system, such as controller 150 of illumination system 100 described above with reference to FIG. 1 though FIG. 7.

Figure 11:
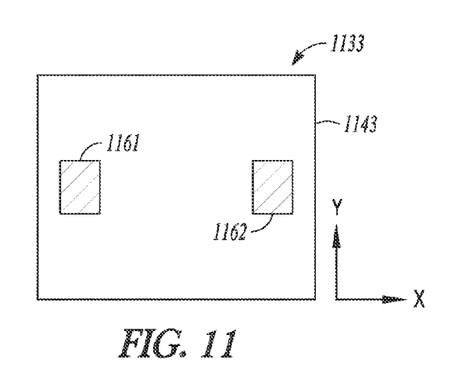
FIG. 11 shows a pupil associated with a modeling of one of the patterns of FIG. 10, according to an embodiment of the invention.

FIG. 11 shows a pupil 1133 having a profile 1143, according to an embodiment of the invention. Pupil 1133 can be determined (e.g., calculated) from modeling pattern 1001 of FIG. 10. Profile 1143 can be generated by photolithography simulation software in a computer (e.g. unit 160 of FIG. 1) used to model pattern 1001. In FIG. 11, profile 1143 can include pupil portions 1161 and 1162 with localized light intensity (e.g., pupil fill) substantially higher than that of the rest of pupil 1133.

Figure 12:
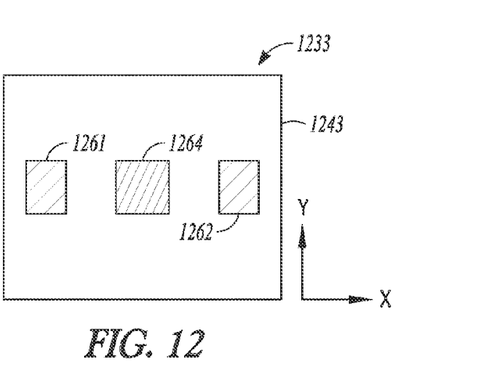
FIG. 12 shows a pupil associated with a modeling of the other pattern in the patterns of FIG. 10, according to an embodiment of the invention.

FIG. 12 shows a pupil 1233 having a profile 1243, according to an embodiment of the invention. Pupil 1233 can be determined (e.g., calculated) from modeling pattern 1002 of FIG. 10. Profile 1243 can be generated by photolithography simulation software in a computer (e.g. unit 160 of FIG. 1) used to model pattern 1002. In FIG. 12, profile 1243 can include pupil portions 1261, 1262, and 1264 with localized light intensity (e.g., pupil fill) substantially higher than that of the rest of pupil 1233.

The parameter values of various elements associated with modeling patterns 1001 and 1002 can be the same except for the values of features 1042 and 1052. For example, if the widths of features 1042 and 1052 are 45 nm and 100 nm, respectively, then the width of features 1042 and 1052 would have different values in the modeling.

In FIG. 11 and FIG. 12, pupils 1133 and 1233 can have the same X-Y coordinates. Pupil portions 1161 (FIG. 11) and 1261 (FIG. 12) can be located at the X-Y coordinates with the same value. Pupil portions 1162 (FIG. 11) and 1262 (FIG. 12) can be located at the X-Y coordinates with the same value.

Determining the information for correcting offsets D1 and D2 (FIG. 10) can include comparing profile 1143 of pupil 1133 (FIG. 11) with profile 1243 of pupil 1233 (FIG. 12) and calculating a selected pupil portion (e.g., pupil fill portion) that belongs (e.g., is unique) to only one of the pupils 1133 and 1233. As shown in FIG. 11 and FIG. 12, pupil portion 1264 belongs only to pupil 1233. Pupil portions 1161, 1162, 1261, and 1262 can be considered as common pupil portions of pupils 1133 and 1233.

Figure 13:
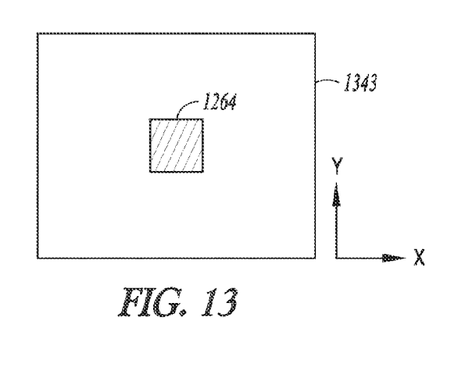
FIG. 13 shows a pupil portion selected from the pupils in FIG. 11 and FIG. 12, according to an embodiment of the invention.
Figure 14:
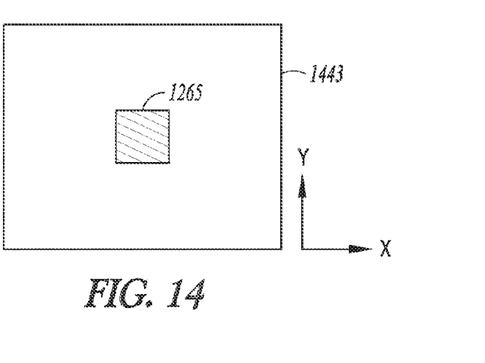
FIG. 14 shows a profile of the pupil portion of FIG. 13 after a function is applied to the pupil portion, according to an embodiment of the invention.

FIG. 13 shows pupil portion 1264 being identified as the selected pupil portion. Pupil portion 1264 has a profile 1343. After selected pupil portion 1264 is identified, a phase function (e.g., XY-phase function) can be applied to pupil portion 1264 to generate a modified pupil portion 1265 (FIG. 14). Modified pupil portion 1265 can correspond to a pupil filter of the model, such as a pupil filter of photolithography simulation software in a computer used to implement the model. The phase function applied to pupil portion 1264 (FIG. 13) can include a Zernike function, such as a Zernike tilt function. Other Zernike functions can be used.

FIG. 14 shows a profile 1443 of pupil portion 1265 after the phase function is applied. As shown in FIG. 14, profile 1443 of pupil portion 1265 is different from profile 1343 in FIG. 13. The difference indicates that light at pupil portion 1265 of FIG. 14 can have a different, non-uniform XY-phase profile from that of pupil portion 1264 in FIG. 13, which may have a constant XY-phase profile. The phase function applied to pupil portion 1264 can be optimized, such that the filter pupil in FIG. 14 created based on pupil portion 1265 can shift pattern 1002 by a certain amount (e.g., measured in units such as nanometers) to minimize the sensitivity (e.g., Zernike sensitivities) of pattern 1002 to pattern 1001. Optimizing the phase function can include applying the phase function with different coefficient values in the phase function for adjusting (e.g., reducing) the difference (e.g., ΔD) between offsets D1 and D2 until the difference is zero or close to zero. Thus, the optimizing process can include applying the phase function in more or more iteration (e.g., repetitions) with different coefficient values in the phase function in different iterations for adjusting the difference between offsets D1 and D2. As an example, if offset D1 is 4.6 nm and offset D2 is 9.7 nm, then a phase function applied to pupil portion 1264 can be optimized such that the created pupil filter in the modeling can shift pattern 1002 away from a reference location (e.g., location 1046 in FIG. 10) along the X-axis by a value of 5.1 nm (9.7 nm-4.6 nm). This optimizing process may reduce offset D2 such that offset D2 can be equal to or substantially equal to offset D1. In this example, optimizing process may reduce offset D2 by 5.1 nm, from 9.7 nm to 4.6 nm, which is the same value as offset D1. Patterns 1001 and 1002 can be deemed satisfactory when the difference (e.g., variation) between offsets D1 and D2 is zero or close to zero (the values of offsets D1 and D2 are the same or substantially the same).

Based on data from the modeling described above with reference to FIG. 10 through FIG. 14, information having a set of parameters, such as a set of Zernike polynomial coefficients associated with the pupil filter, can be calculated. This information can be provided to a controller (e.g., controller 150 of FIG. 1) of an illumination system. Based on the set of Zernike polynomial coefficients, the controller can reproduce the phase shift (e.g., by using software in the controller) in the X-Y pupil in the projection lens assembly of the illumination system.

Alternatively or in addition to the a set of Zernike polynomial coefficients, an X-Y wave-front map based on the modeling described above with reference to FIG. 10 through FIG. 14 can be provided to the controller of the illumination system. For example, as shown in FIG. 14, the pupil filter at pupil portion 1265 can contain phase and amplitude information and X-Y coordinates describing a wave-front adjustment of a pupil. The X-Y coordinates of the pupil filter can correspond to X-Y coordinates of one or more zones of a phase shifter of a projection lens assembly of an illumination system, such as phase shifter 134 of FIG. 1 and FIG. 3. Based on the information from this X-Y wave-front map, the controller can selectively adjust the zones located at corresponding X-Y coordinates of a phase shifter (e.g., phase shifter 134 in FIG. 1 and FIG. 3).

Based on the set of Zernike polynomial coefficients or the X-Y wave-front map, as described above, the illumination system can form the same patterns at different locations as needed (e.g., shifts in the X direction of patterns 1001 and 1002) using the same mask, such as mask 120 of FIG. 1. For example, the technique described herein with reference to FIG. 10 through FIG. 14 can be used to manipulate the pattern placement on the wafer, such as to reduce the relative pattern location difference ΔD, if the difference ΔD is undesired (e.g., result of lens aberration). In another example, the technique described herein can also be used to increase the ΔD, if increasing the ΔD is a process optimization goal.

Figure 15:
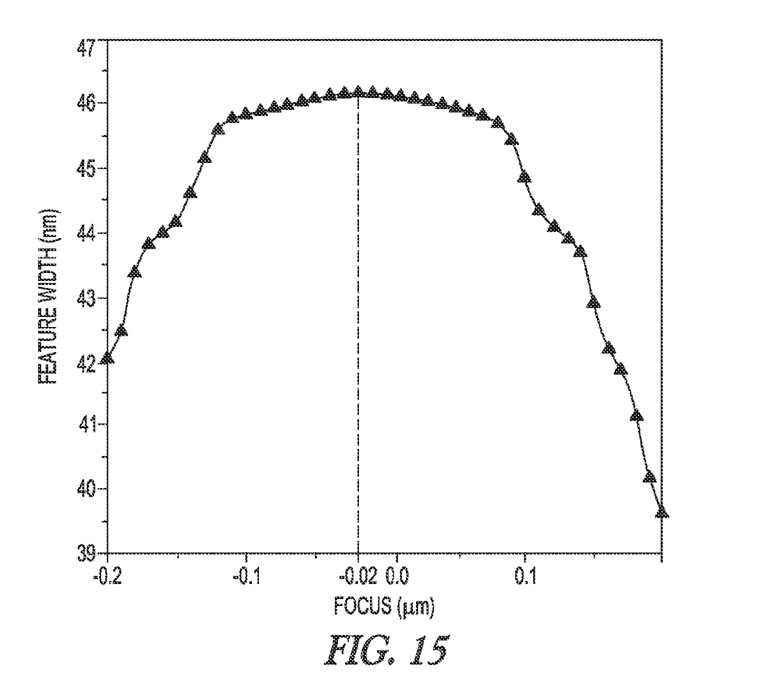
FIG. 15 is a graph showing a relationship between focus and feature width of a pattern, according to an embodiment of the invention.
Figure 16:
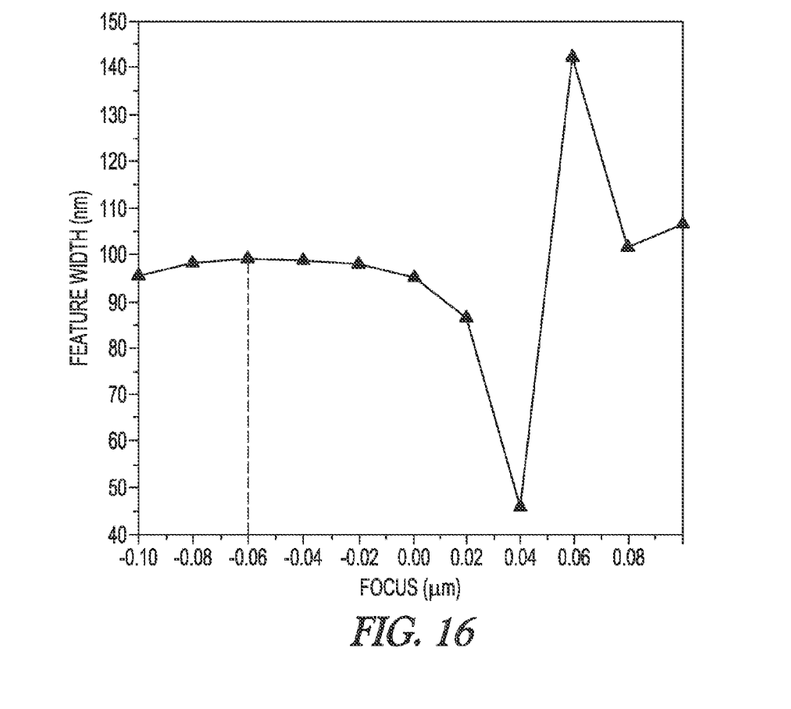
FIG. 16 is a graph showing a relationship between focus and feature width of another pattern, according to an embodiment of the invention.

FIG. 15 is a graph showing a relationship between focus and feature width of a pattern, according to an embodiment of the invention. The graph in FIG. 15 can be generated by photolithography simulation software in a computer (e.g. unit 160 of FIG. 1) used to model the pattern. The pattern associated with FIG. 15 can include a one-to-one (1:1) line and space pattern with a feature width of 45 nm. FIG. 16 is a graph showing a relationship between focus and feature width of another pattern, according to an embodiment of the invention. The graph in FIG. 16 can be generated by photolithography simulation software in a computer (e.g. unit 160 of FIG. 1) used to model the pattern. The pattern associated with FIG. 16 can include a one-to-one (1:1) line and space pattern with a feature width of 100 nm. The patterns associated with FIG. 15 and FIG. 16 can be similar to or identical to patterns 1001 and 1002, respectively, of FIG. 10. As shown in FIG. 15, the focus at −0.02 μm (micrometer) can correspond to the best focus of the pattern associated with FIG. 15. The best focus can be the average of the light interferences in different X-Y planes along the Z-axis. In FIG. 16, the focus at −0.6 μm can be the best focus of the pattern associated with FIG. 16.

The best focus difference between the pattern associated FIG. 15 and the pattern associated FIG. 16 is usually undesirable. This best focus difference can be caused by various factors similar to those causing pattern shifts described above with reference to FIG. 10. The following description with reference to FIG. 17 through FIG. 22 describes an example for determining information for correcting (e.g., adjusting) or minimizing the undesirable best focus difference associated with FIG. 15 and FIG. 16. This information can correspond to information IN4 (FIG. 8) and can be provided to a controller of an illumination system, such as controller 150 of illumination system 100 described above with reference to FIG. 8.

Figure 17:
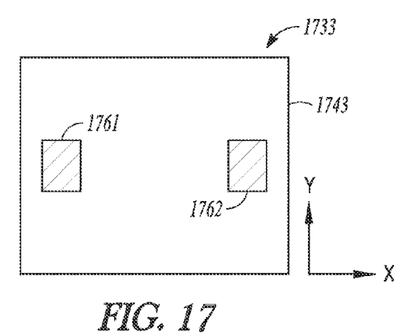
FIG. 17 shows a pupil associated with a modeling of the pattern associated with FIG. 15, according to an embodiment of the invention.

FIG. 17 shows a pupil 1733 having a profile 1743, according to an embodiment of the invention. Pupil 1733 can be determined (e.g., calculated) from modeling the pattern associated with FIG. 15. Profile 1743 can be generated by photolithography simulation software used to model the pattern associated with FIG. 15. In FIG. 17, profile 1743 can include pupil portions 1761 and 1762 with localized light intensity (e.g., pupil fill) substantially higher than that of the rest of pupil 1733.

Figure 18:
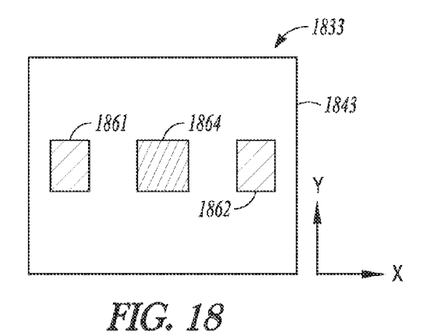
FIG. 18 shows a pupil associated with a modeling of the pattern associated with FIG. 16, according to an embodiment of the invention.

FIG. 18 shows a pupil 1833 having a profile 1843, according to an embodiment of the invention. Pupil 1833 can be determined (e.g., calculated) from modeling the pattern associated with FIG. 16. Profile 1843 can be generated by photolithography simulation software used to model the pattern associated with FIG. 16. In FIG. 18, profile 1843 can include pupil portions 1861, 1862, and 1864 with localized light intensity (e.g., pupil fill) substantially higher than that of the rest of pupil 1833.

The parameter values of various elements associated with modeling patterns associated with FIG. 15 and FIG. 16 can be the same except for the values (e.g., feature width values) of the features of the patterns.

In FIG. 17 and FIG. 18, pupils 1733 and 1833 can have the same X-Y coordinates. Pupil portions 1761 (FIG. 17) and 1861 (FIG. 18) can be located at the X-Y coordinates with the same value. Pupil portions 1762 (FIG. 11) and 1862 (FIG. 12) can be located at the X-Y coordinates with the same value.

Determining the information for correcting the best focus can include comparing profile 1743 of pupil 1733 (FIG. 17) with profile 1843 of pupil 1833 (FIG. 18) and calculating a selected pupil portion (e.g., pupil fill) that belongs (e.g., is unique) to only one of pupils 1733 and 1833. As shown in FIG. 17 and FIG. 18, pupil portion 1864 belongs to only pupil 1833. Pupil portions 1761, 1762, 1861, and 1862 can be considered as common pupil portions of pupils 1733 and 1833.

Figure 19:
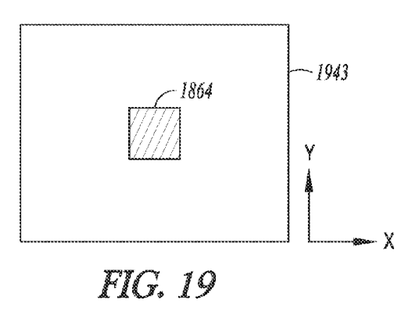
FIG. 19 shows a pupil portion selected from the pupils in FIG. 17 and FIG. 18, according to an embodiment of the invention.
Figure 20:
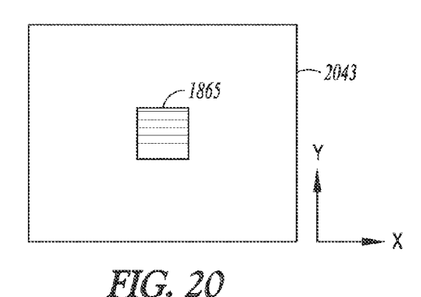
FIG. 20 shows a profile of the pupil portion of FIG. 19 after a function is applied to the pupil portion, according to an embodiment of the invention.

FIG. 19 shows pupil portion 1864 being identified as the selected portion. Pupil portion 1864 has a profile 1943. After selected pupil portion 1864 is identified, a phase function (e.g., XY-phase function) can be applied to pupil portion 1864 to generate a modified pupil portion 1865 (FIG. 20). Modified pupil portion 1865 can correspond to a pupil filter of the model, such as a pupil filter of photolithography simulation software used to implement the model. The phase function applied to pupil portion 1864 (FIG. 19) can include a Zernike function, such as a Zernike defocus function. Other Zernike functions can be used.

FIG. 20 shows a profile 2043 of pupil portion 1865 after the phase function is applied. As shown in FIG. 20, profile 2043 of pupil portion 1865 is different from profile 1943 in FIG. 19. The difference indicates that the light at pupil portion 1865 can have a different phase from that of pupil portion 1864 in FIG. 19. The phase function applied to pupil portion 1864 can be optimized, such that the created filter pupil in FIG. 20 can shift the best focus of one of the patterns associated with FIG. 15 and FIG. 16 at a certain amount (e.g., measured in units such as nanometers) to reduce the difference between the best focus in FIG. 15 and the best focus in FIG. 16. Optimizing the phase function can include applying the phase function with different coefficient values in the phase function for adjusting (e.g., reducing) the difference (e.g., variation) between the best focus in FIG. 15 and the best focus in FIG. 16. The optimizing process can include applying the phase function in more or more iteration (e.g., repetitions) with different coefficient values in the phase function in different iterations for adjusting the difference between the best focus. For example, the phase function applied to pupil portion 1864 can be optimized such that the pupil filter created based on pupil portion 1865 in the modeling can shift the best focus in FIG. 16 along the X-axis by a value of 0.04 μm (−0.2−(−0.06 μm)). Thus, optimizing the phase function in this example includes causing the best focus in FIG. 16 to be the same (or substantially the same) as the best focus in FIG. 15. When the patterns associated with FIG. 15 and FIG. 16 are formed on the same substrate, these patterns can be deemed satisfactory when their best focus difference (e.g., variation in best focus) is zero or close to zero.

Figure 21:
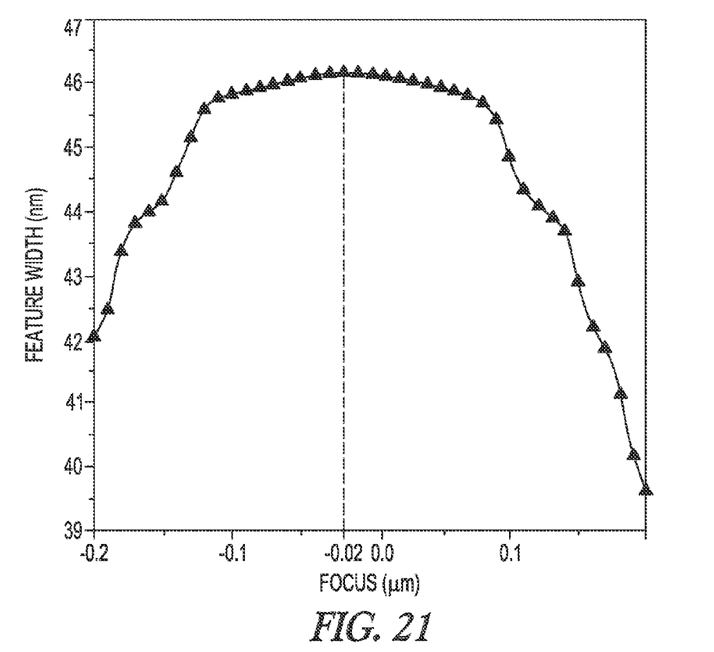
FIG. 21 is a graph showing a relationship between focus and feature width of the pattern associated with FIG. 15 after the pupil filter in FIG. 20 is used in a modeling of the pattern, according to an embodiment of the invention.

FIG. 21 is a graph showing a relationship between focus and feature width of the pattern associated with FIG. 15 after the pupil filter in FIG. 20 is used in a modeling of the pattern, according to an embodiment of the invention.

Figure 22:
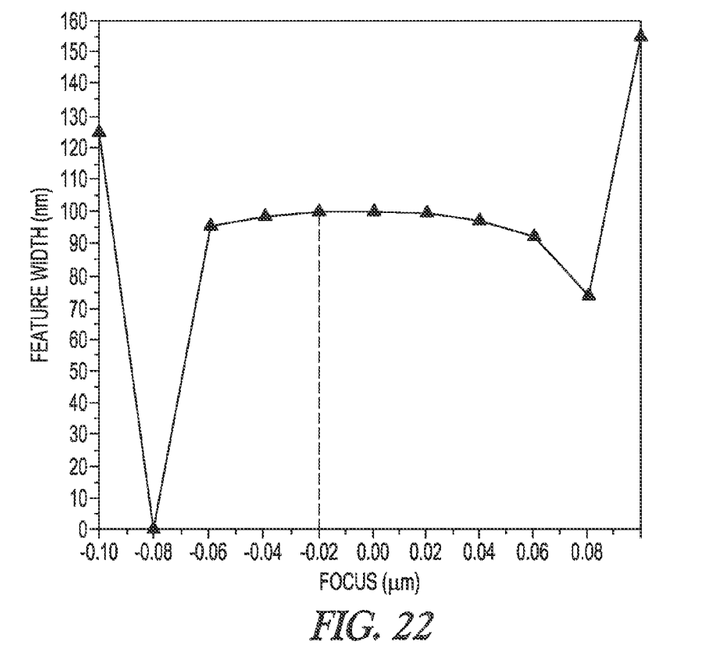
FIG. 22 is a graph showing a relationship between focus and feature width of the pattern associated with FIG. 16 after the pupil filter in FIG. 20 is used in a modeling of the pattern, according to an embodiment of the invention.

FIG. 22 is a graph showing a relationship between focus and feature width of the pattern associated with FIG. 16 after the pupil filter in FIG. 20 is used in a modeling of the pattern, according to an embodiment of the invention.

As shown in each of FIG. 21 and FIG. 22, the best focuses both have the value of −0.02 μm. Thus, the best focus difference is zero.

Based on data from the modeling described above with reference to FIG. 15 through FIG. 22, information having a set of parameters, such as a set of Zernike polynomial coefficients associated with the pupil filter, can be calculated. This information can be provided to a controller (e.g., controller 150 of FIG. 1) of an illumination system. Based on the set of Zernike polynomial coefficients, the controller can reproduce the phase shift (e.g., by using software in the controller) in the X-Y pupil in the projection lens assembly of an illumination system. Then, the illumination system can form patterns with different dimensions (e.g., patterns associated with FIG. 15 and FIG. 16) using the same mask, such as mask 120 of FIG. 1)

Alternatively or in addition to the set of Zernike polynomial coefficients, an X-Y wave-front map based on the modeling described above with reference to FIG. 15 through FIG. 20 can be provided to the controller of the illumination system. For example, as shown in FIG. 20, the pupil filter at pupil portion 1865 can contain phase and amplitude information and X-Y coordinates describing a wave-front adjustment of a pupil. The X-Y coordinates of the pupil filter can correspond to X-Y coordinates of one or more zones of a phase shifter of a projection lens assembly of an illumination system, such as phase shifter 134 of FIG. 1 and FIG. 3. Based on the information from this X-Y wave-front map, the controller can selectively adjust the zones located at corresponding X-Y coordinates of a phase shifter (e.g., phase shifter 134 in FIG. 1 and FIG. 3).

Figure 23:
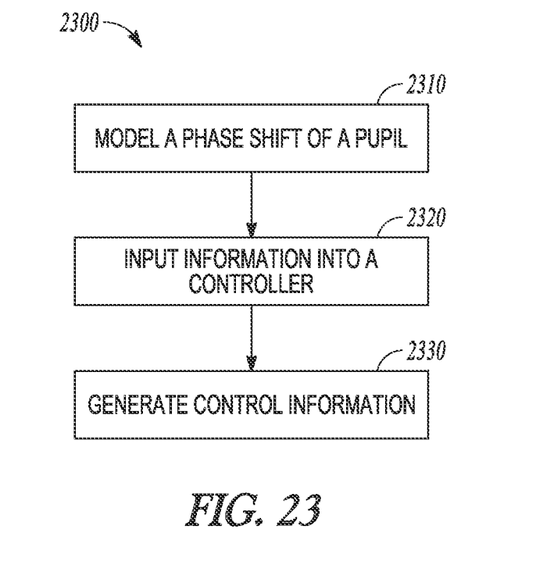
FIG. 23 is a flowchart showing a method, according to an embodiment of the invention.

FIG. 23 is a flowchart showing a method 2300, according to an embodiment of the invention. Method 2300 can be used in an illumination system, such as the illumination system described above with reference to FIG. 1 through FIG. 22.

In FIG. 23, method 2300 can include activity 2310 to model a phase shift of a pupil. The modeling can be formed using photolithography simulation software. One or more pupil portions of the pupil can be selected in the model. A phase function, such as a Zernike function, can be applied to the selected pupil portion to form a pupil filter. The phase function can be optimized so that the pupil filter can reduce variations (e.g., differences in Zernike sensitivities) between different features formed in the model. Based on the data from the modeling, activity 2310 can provide a linear combination of a number of Zernike terms. Activity 2310 can also provide an X-Y wave-front map of the pupil filter. The map can include phase and amplitude information and X-Y coordinates describing a wave-front adjustment of a pupil. The X-Y coordinates of the X-Y wave-front map can correspond to X-Y coordinates of one or more zones of a phase shifter of a projection lens assembly of an illumination system, such as phase shifter 134 of FIG. 1 and FIG. 3.

Method 2300 can include activity 2320 to input information into a controller that controls a projection lens assembly of an illumination system. The information can include a linear combination of a number of Zernike terms. The information can also include an X-Y wave-front map of a pupil filter generated in activity 2310.

Method 2300 can also include activity 2330 to generate control information based on the input information to the controller in activity 2320. Activity 2330 can also adjust a phase shifter in the projection lens assembly in order to adjust the phase of light passing through specific zones in the X-Y coordinates of the phase shifter. Light from the projection lens assembly can produce patterns on a material of a substrate. The pattern can include dimensions based on the information input into the controller.

Method 2300 can include activities described above with reference to FIG. 1 through FIG. 22. Thus, method 2300 can include fewer or more activities than the activities shown in FIG. 23.

The illustrations of apparatus and system (e.g., illumination system 100) are intended to provide a general understanding of the structure of various embodiments and are not intended to provide a complete description of all the elements of the apparatus that might make use of the structures described herein.

The embodiments described above with reference to FIG. 1 through FIG. 23 include system and methods to obtain information for adjusting variations in features formed on a substrate of a semiconductor device. Such methods can include determining a first pupil in an illumination system used to form a first feature, and determining a second pupil used to form a second feature. The methods can also include determining a pupil portion belonging to only one of the pupils, and generating a modified pupil portion from the pupil portion. Information associated with the modified pupil portion can be obtained for controlling a portion of a projection lens assembly of an illumination system. Other embodiments are described above with reference to FIG. 1 through FIG. 23.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and patterns of some embodiments may be included in, or substituted for, those of others. Many other embodiments will be apparent to those of skill in the art upon reading and understanding the above description.

What is claimed is:

1. A method comprising:
   determining a first pupil associated with a first feature;
   determining a second pupil associated with a second feature;
   determining a pupil portion belonging to only one of the first and second pupils, wherein the first and second pupils include at least one common pupil portion;
   generating a modified pupil portion from the pupil portion; and
   obtaining information associated with the modified pupil portion for controlling at least a portion of a projection lens assembly of an illumination system, wherein determining the first and second pupils, determining the pupil portion, generating the modified pupil portion, and obtaining the information are performed by at least one computer.

2. The method of claim 1, wherein generating the modified pupil portion includes applying a function to the pupil portion.

3. The method of claim 2, wherein the function includes a Zernike function.

4. The method of claim 1, wherein first and second features have different dimensions.

5. The method of claim 1, wherein the information includes a set of Zernike polynomial coefficients.

6. The method of claim 1, wherein the information includes phase and amplitude information and X-Y coordinates describing a wave-front of a pupil associated with the first and second features.

7. A method comprising:
   determining a first pupil associated with a first feature;
   determining a second pupil associated with a second feature, wherein the first and second pupils include at least one common pupil portion;
   determining a selected pupil portion unique to one of the first and second pupils;
   applying a XY-phase function to the selected pupil portion; and
   optimizing the XY-phase function to adjust variation between the first and second features, wherein determining the first and second pupils, determining the selected pupil portion, applying the XY-phase function, and optimizing the XY-phase function are performed by at least one computer.

8. The method of claim 7, wherein the XY-phase function includes a Zernike function.

9. The method of claim 7, wherein the XY-phase function includes a Zernike tilt function.

10. The method of claim 7, wherein the XY-phase function includes a Zernike defocus function.

11. The method of claim 7, wherein the first feature corresponds to one of a line and a space of a first pattern formed on a substrate.

12. The method of claim 11, wherein the second feature corresponds to one of a line and a space of a second pattern formed on the substrate.

13. A method comprising:
   selecting a pupil portion from one of a first pupil and a second pupil, the first pupil associated a first feature, the second pupil associated a second feature, wherein the first and second pupils include at least one common pupil portion;
   applying a phase function to the pupil portion to generate a pupil filter; and
   optimizing the phase function to enable the pupil filter to adjust a variation between the first and second features, wherein selecting the pupil, applying the phase function, and optimizing the phase function are performed by at least one computer.

14. The method of claim 13, wherein the phase function includes a Zernike phase function.

15. The method of claim 13, further comprising:
   determining a set of Zernike polynomial coefficients based on the pupil filter.

16. The method of claim 13, wherein the first and second features have different widths.

17. The method of claim 13, wherein first feature is part of a first pattern, the second feature is part of a second pattern, and the variation includes variation between an offset of the first pattern relative to a reference location and an offset of the second pattern relative to the reference location.

18. The method of claim 13, wherein first feature is part of a first pattern, the second feature is part of a second pattern, and the variation includes variation between a best focus of the first pattern and a best focus of the second pattern.

19. A method comprising:
   obtaining a first pupil associated with a modeling of a first pattern;
   obtaining a second pupil associated with a modeling of a second pattern;
   identifying a pupil portion unique to the second pupil;
   modifying phase shift information of the pupil portion; and
   determining a set of Zernike polynomial coefficients based on the phase shift information, wherein obtaining the first and second pupils, identifying the pupil portion, modifying the phase shift information, and determining the set of Zernike polynomial coefficients are performed by at least one computer.

20. The method of claim 19, further comprising:
   providing the set of Zernike polynomial coefficients to a controller of an illumination system.

21. The method of claim 20, further comprising:
   controlling a projection lens assembly in the illumination system based at least in part on the set of Zernike polynomial coefficients.

22. The method of claim 19, wherein the first and second pattern have different dimensions.

23. The method of claim 19, wherein the pupil portion includes a pupil fill of the second pupil.

* * * * *